United States Patent [19]

Nomura et al.

[11] Patent Number: 5,694,078
[45] Date of Patent: Dec. 2, 1997

[54] SEMICONDUCTOR INTEGRATED CIRCUIT HAVING REGULARLY ARRANGED TRANSISTOR BASIC CELLS

[75] Inventors: Katsunobu Nomura; Masaya Tamamura; Shinichi Shiotsu; Hojo Masayasu, all of Kawasaki, Japan

[73] Assignee: Fujitsu Limited, Kawasaki, Japan

[21] Appl. No.: 227,348

[22] Filed: Apr. 14, 1994

[30] Foreign Application Priority Data

May 31, 1993 [JP] Japan .................... 5-128922

[51] Int. Cl.⁶ ............... H01L 27/10; H03K 19/173
[52] U.S. Cl. ................. 327/565; 327/566; 257/205
[58] Field of Search .................... 327/564, 565, 327/566; 257/205, 208, 552, 553, 773

[56] References Cited

U.S. PATENT DOCUMENTS

| | | | |
|---|---|---|---|
| 4,591,894 | 5/1986 | Kawakami | 357/42 |
| 4,809,029 | 2/1989 | Matsumura et al. | 364/900 |
| 4,920,398 | 4/1990 | Yoshio et al. | 357/42 |
| 4,947,233 | 8/1990 | Aso | 357/65 |
| 5,124,776 | 6/1992 | Tanizawa et al. | 357/45 |
| 5,329,156 | 7/1994 | Bartlow | 257/773 |

FOREIGN PATENT DOCUMENTS 62-23618   1/1987   Japan .

OTHER PUBLICATIONS

Goodenough, "Mixed–Mode Arrays Give Designers Options," *Electronic Design*, Oct. 13, 1988, pp. 149–154.

Primary Examiner—Timothy P. Callahan
Assistant Examiner—T. T. Lam
Attorney, Agent, or Firm—Staas & Halsey

[57] ABSTRACT

A semiconductor integrated circuit includes a chip having an element forming surface with a side thereof extending along a first direction, an output buffer portion provided on the element forming surface of the chip, a plurality of output transistors having different emitter areas provided on the element forming surface of the chip and arranged approximately in a line along a second direction, which is perpendicular to the first direction, and a pad provided on the element forming surface of the chip. An output circuit is formed by the output buffer portion, a portion or all of the output transistors and the pad. The output buffer portion, the output transistors and the pad are arranged approximately in a line along the second direction.

13 Claims, 10 Drawing Sheets

SEMICONDUCTOR INTEGRATED CIRCUIT HAVING REGULARLY ARRANGED TRANSISTOR BASIC CELLS

BACKGROUND OF THE INVENTION

1. Field of the Invention

The present invention generally relates to semiconductor integrated circuits and, more particularly to a semiconductor integrated circuit having transistor basic circuits (transistor basic cells) arranged regularly in a matrix arrangement, that is, using the so-called gate array.

2. State of the Prior Art

Figure 1:
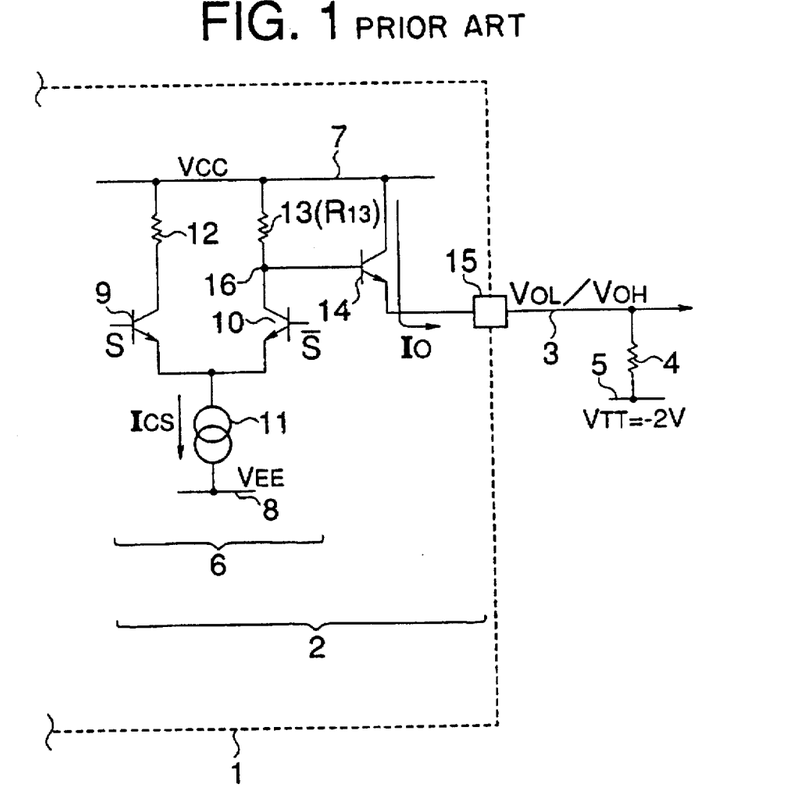
FIG. 1 is a circuit diagram showing a portion of an example of a conventional semiconductor integrated circuit using the gate array.

FIG. 1 is a circuit diagram showing a portion of an example of a conventional semiconductor integrated circuit (IC) using the gate array.

The semiconductor IC shown in FIG. 1 includes a chip body 1, an output circuit 2, a signal transmission line 3, a terminating resistor 4 having an impedance matched to the characteristic of the signal transmission line 3, and a voltage line 5 supplied with a voltage VTT. For example, the voltage VTT is −2 V.

The output circuit 2 includes an output buffer portion (i.e., "output buffer") 6 which is made up of a differential amplifier circuit, an output transistor 14, and a pad (or electrode) 15. In FIG. 1, a power supply line 7 supplies a high voltage side power supply voltage VCC which is 0 V, for example, and a power supply line 8 supplies a low voltage side power supply voltage VEE which is −5.2 V, for example.

The output buffer portion 6 includes driving transistors 9 and 10 which are made up of NPN transistors, a constant current source circuit 11, and resistors 12 and 13 which are provided as loads with respect to the driving transistors 9 and 10. A signal S is supplied to a gate of the driving transistor 9, and a signal /S which is an inverted signal of the signal S is supplied to a gate of the driving transistor 10.

The output transistor 14 of the output circuit 12 is made up of an NPN transistor.

In order to make a gate array for rem such a semiconductor IC general-purpose, it is necessary to enable variations of the output power of the output circuit 2 so as to make the processing speed selectable.

In this case, it is necessary that the output level (level of the pad 15) can be adjusted and set to constant values, regardless of the magnitude of the output power of the output circuit 2. In other words, it must be able to adjust and set the output level to −1.7 V, for example, in the case of a low level, and to −0.9 V, for example, in the case of a high level, regardless of the magnitude of the output power of the output circuit 2.

First, a description will be given for the case where the output level is a low level. In other words, it will be studied how the low level of a output level can be adjusted and set to the constant value regardless of the magnitude of the output power of the output circuit 2.

A voltage (low-level voltage) $V_{OL}$ of the pad 15, when the output level is the low level, can be described by $V_{OL}$= VCC−$R_{13}$·$I_{CS}$−$V_{BE}$, where $R_{13}$ denotes the resistance of the resistor 13, $I_{CS}$ denotes the current flowing through the constant current source circuit 11, and $V_{BE}$ denotes the base-emitter voltage of the output transistor 14.

Accordingly, the low-level voltage $V_{OL}$ can be set to the constant value regardless of the output power, that is, even if the current $I_{CS}$ changes, if $R_{13}$ is set so that $R_{13}$=(VCC−$V_{BE}$−$V_{OL}$)/$I_{CS}$.

For example, when VCC=0 V, $V_{BE}$=0.8 V and $V_{OL}$=−1.7 V, the low-level voltage $V_{OL}$ can be set to the constant value of −1.7 V even if the current $I_{CS}$ changes, by setting the resistance $R_{13}$ to $R_{13}$=(VCC−$V_{BE}$−$V_{OL}$)/$I_{CS}$=[0−0.8−(−1.7)]/$I_{CS}$=0.9/$I_{CS}$.

For the sake of convenience, the output power of the output circuit 2 will be categorized into 3 kinds or level, namely, a low power, a middle power and a high power. In this case, when the current $I_{CS}$ of the constant current source circuit 11 is set to 4 mA, 8 mA and 16 mA for the corresponding low power, middle power and high power, the resistance $R_{13}$ of the resistor 13 that is required to make the low-level voltage $V_{OL}$ have the constant value of −1.7 V becomes as shown in the following Table 1.

TABLE 1

| Output Power | $R_{13}$ |
| --- | --- |
| Low Power | $R_{13}$ =0.9/0.004 = 225 Ω |
| Middle Power | $R_{13}$ =0.9/0.008 = 225/2 Ω |
| HighPower | $R_{13}$ =0.9/0.016 = 225/4 Ω |

Next, a description will be given for the case where the output level is the high level. In other words, it will be studied how the high level of the output level can be adjusted and set to the constant value regardless of the magnitude of the output power of the output circuit 2.

An output current $I_O$ when the output level is the high level can be described by $I_O$=($V_{OH}$−VTT)/$R_4$, where $V_{OH}$ denotes a voltage (high-level voltage) of the pad 15 when the output level is the high level and $R_4$ denotes the resistance of the terminating resistor 4. Hence, when $V_{OH}$=−0.9 V and $R_4$=50 Ω, the output current $I_O$ is $I_O$=[−0.9−(−2.0)]/50= 0.022 A=22 mA.

Accordingly, in this case, a base current $I_B$ of the output transistor 14 can be described by $I_B$=$I_O$/$h_{fe}$, where $h_{fe}$ denotes the current amplification of the output transistor 14. When the current amplification $h_{fe}$=100, the base current $I_B$ is $I_B$=0.022/100=0.00022 A=0.22 mA.

As a result, a voltage drop $\Delta V_{13}$ of the resistor 13 due to the base current $I_B$ takes a different value for each of the high, middle and low powers, as shown in the following Table 2.

TABLE 2

| Output Power | $\Delta V_{13}$ |
| --- | --- |
| Low Power | $\Delta V_{13}$ = 0.22 × 10⁻³ × 225<br>= 0.050 V<br>= 50 mV |
| Middle Power | $\Delta V_{13}$ = 0.22 × 10⁻³ × 225/2<br>= 0.025 V<br>= 25 mV |
| High Power | $\Delta V_{13}$ = 0.22 × 10⁻³ × 225/4<br>= 0.012 V<br>= 12 mV |

In this particular case, the voltage drop $\Delta V_{13}$ of the resistor 13 differs by approximately 38 mV between the case where the output power is the low power and the case where the output power is the high power. This difference in the voltage drop $\Delta V_{13}$ appears as a level difference at a node 16 shown in FIG. 1, and this would make value of the high-level voltage $V_{OH}$ different, depending on the output power.

In order to eliminate this problem and to adjust and set the high-level voltage $V_{OH}$ to a constant value, regardless of the magnitude of the output power of the output circuit 2, a method has been proposed to adjust and set the base-emitter voltage $V_{BE}$ of the output transistor 14 to a different value, depending on the output power.

Figure 2:
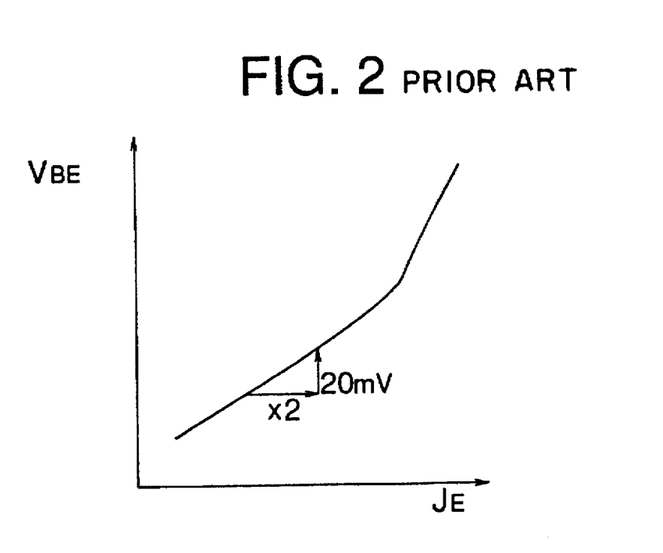
FIG. 2 is a diagram showing an emitter current density $J_E$ versus base-emitter voltage $V_{BE}$ characteristic of an NPN transistor.

An emitter current density $J_E$ versus base-emitter voltage $V_{BE}$ characteristic of the NPN transistor becomes is as shown in FIG. 2. Hence, in the NPN transistor, the base-emitter voltage $V_{BE}$ increases by approximately 20 mV when the emitter current density $J_E$ is doubled.

It can be seen from the characteristic of the NPN transistor shown in FIG. 2 that a voltage of approximately 38 mV, which is the difference between the voltage drop $\Delta V_{13}$ of the resistor 13 in the case of the low power and the voltage drop $\Delta V_{13}$ of the resistor 13 in the case of the high power, corresponds to a difference of approximately four times in terms of the emitter current density $J_E$.

Accordingly, if the emitter current density of the output transistor 14 when the output power is the high power can be set to four times the emitter current density of the output transistor 14 when the output power is the low power, the high-level voltage $V_{OH}$ can be adjusted and set to the constant value, regardless of whether the output power is the high power or the low power.

In other words, the high-level voltage $V_{OH}$ can be adjusted and set to the constant value regardless of whether the output power is the low power, the middle power or the high power, if an output transistor for the low power, an output transistor for the middle power and an output transistor for the high power, having respective, different emitter areas, are provided as the NPN transistors for forming the output transistor 14 and one of these (3) output transistors is selectively used as the output transistor 14.

In this case, the output transistor for the lower power has the largest emitter area, and the output transistor for the high power has the smallest emitter area. The output transistor for the middle power has an emitter area which falls between the emitter areas of the output transistors for the low and high powers.

When there are variations of the output power, a corresponding number of output transistors are required. However, according to the conventional gate array, one (1) output circuit is formed by one (1) output buffer portion, three (3) output transistors and one (1) pad, for example. In this case, the output buffer portion, the output transistors and the pad are arranged as shown in FIG. 3.

Figure 3:
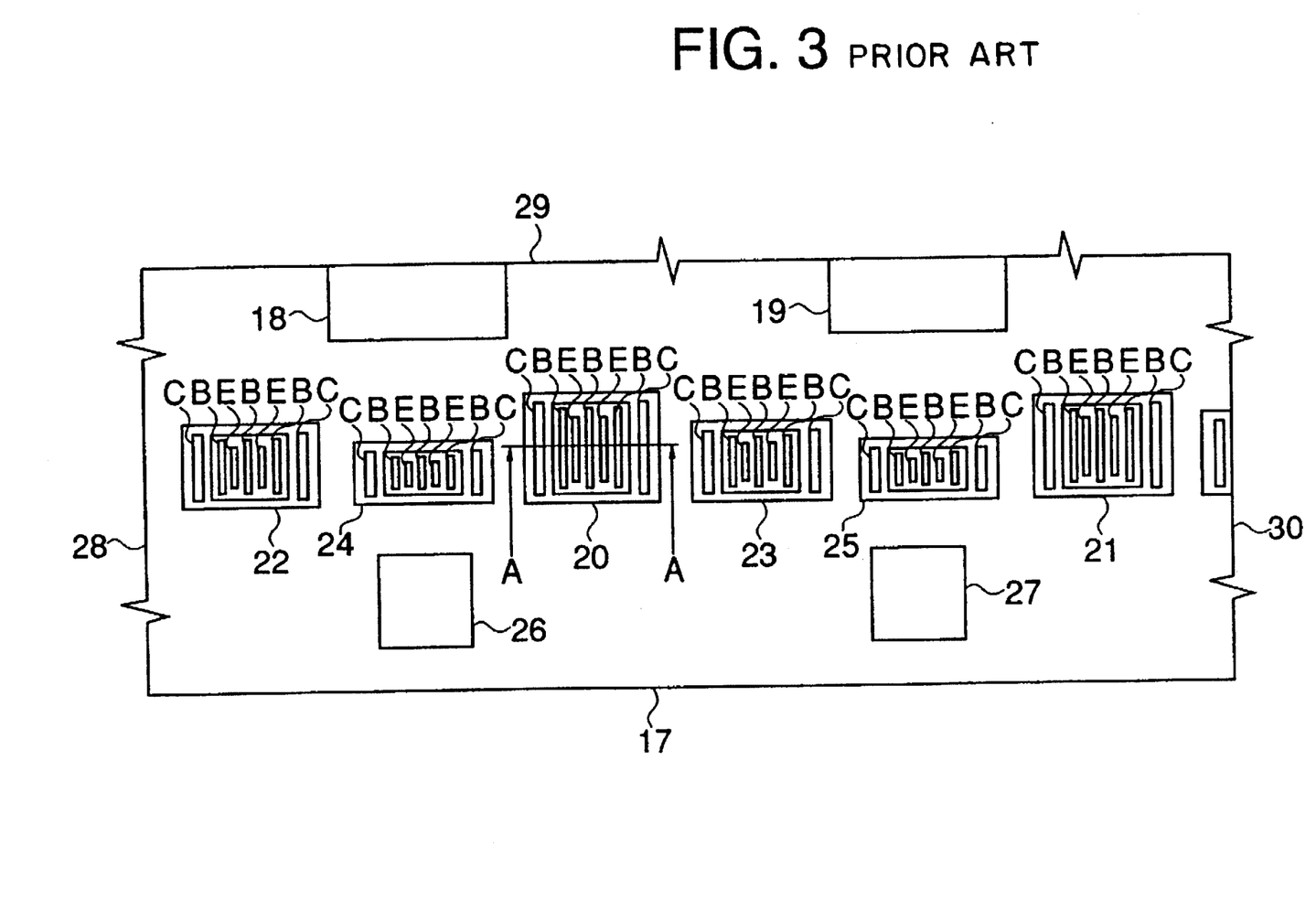
FIG. 3 is a plan view generally showing an arrangement of output transistors in the conventional gate array.

FIG. 3 shows one side 17 of an element forming surface of a chip, output buffer portions 18 and 19, output transistors 20 and 21 for the low power, output transistors 22 and 23 for the middle power, output transistors 24 and 25 for the high power, and pads 26 and 27. The output transistors 20 through 25 respectively each have a collector C, a base B and an emitter E. In FIG. 3, broken lines 28, 29 and 30 are used for the sake of convenience.

Figure 4:
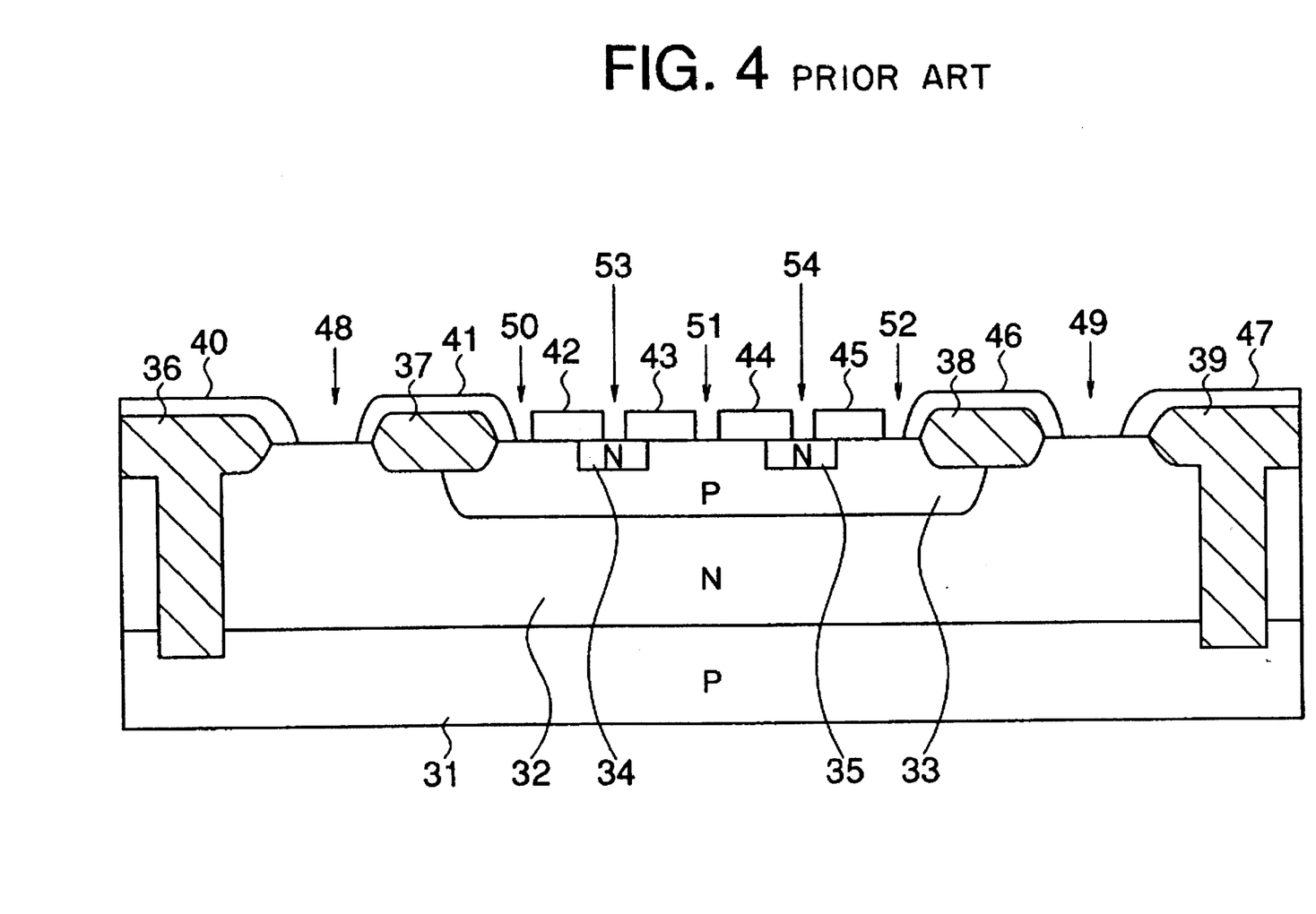
FIG. 4 is a cross sectional view of the output transistor along a line 4—4 in FIG. 3.

FIG. 4 is a cross sectional view along a line A—A in FIG. 3, and shows the cross sectional structure of the output transistor 20. The cross sectional structure each of of the other output transistors 21 through 25 is similar to that of the output transistor 20.

In FIG. 4, there are shown a P-type silicon substrate 31, an N-type layer 32 forming the collector, a P-type layer 33 forming the base, N-type layers 34 and 35 forming the emitters, and insulator layers 36 through 47. Collector windows 48 and 49 are provided for making contact with the N-type layer (collector) 32. Base windows 50 through 52 are provided for making contact with the P-type layer (base) 33. In addition, emitter windows 53 and 54 are provided for making contact with the N-type layers (emitters) 34 and 35.

In FIG. 3, The output transistors 20, 22 and 24 are provided in correspondence with the output buffer portion 18. In addition, the pad 26 is provided in correspondence with the output transistors 20, 22 and 24. In addition, the output transistors 21, 23 and 25 are provided in correspondence with the output buffer portion 19. The pad 27 is provided in correspondence with the output transistors 21, 23 and 25.

In other words, one (1) output circuit can be formed by the output buffer portion 18, one of the output transistors 20, 22 and 24, and the pad 26. In addition, one (1) output circuit can be formed by the output buffer portion 19, one of the output transistors 21, 23 and 25, and the pad 27.

According to the gate array shown in FIG. 3, the output transistors 22, 24 and 20 are arranged parallel to the side 17 of the element forming surface adjacent to the pad 26, that is, in a direction perpendicular to a direction in which the output buffer portion 18 and the pad 26 are arranged.

On the other hand, the output transistors 23, 25 and 21 are arranged parallel to the side 17 of the element forming surface adjacent to the pad 27, that is, in a direction perpendicular to a direction in which the output buffer portion 19 and the pad 27 are arranged.

Hence, when a plurality of output transistors are provided for the purpose of forming one (1) output circuit in the conventional gate array, these output transistors were arranged parallel to the side of the element forming surface of the chip adjacent to the corresponding pad, that is, in a direction perpendicular to a direction in which the corresponding output buffer portion and the pad are arranged.

For this reason, the gate array must employ a layout such that the pads are arranged at large intervals. For example, the distance between the pads 26 and 27 in FIG. 3 must be set to be large. As a result, there is a problem in that the chip area becomes large due to such a layout.

SUMMARY OF THE INVENTION

Accordingly, it is a general object of the present invention to provide a novel and useful semiconductor integrated circuit in which the problems described above are eliminated.

Another and more specific object of the present invention is to provide a semiconductor integrated circuit comprising a chip having an element forming surface with a side, or edge, thereof extending in a first direction, an output buffer portion provided on the element forming surface of the chip, a plurality of output transistors having different emitter areas provided on the element forming surface of the chip and arranged approximately in a line along a second direction which is perpendicular to the first direction, and a pad provided on the element forming surface of the chip, an output circuit being formed by the output buffer portion and a portion or all of the output transistors, the pad, the output buffer portion, the output transistors and the pad being arranged approximately in a line along the second direction. According to the semiconductor integrated circuit of the present invention, it is possible to narrow the intervals of the pads, and thus reduce the chip area.

Other objects and further features of the present invention will be apparent from the following detailed description when read in conjunction with the accompanying drawings.

DESCRIPTION OF THE PREFERRED EMBODIMENTS

Figure 5:
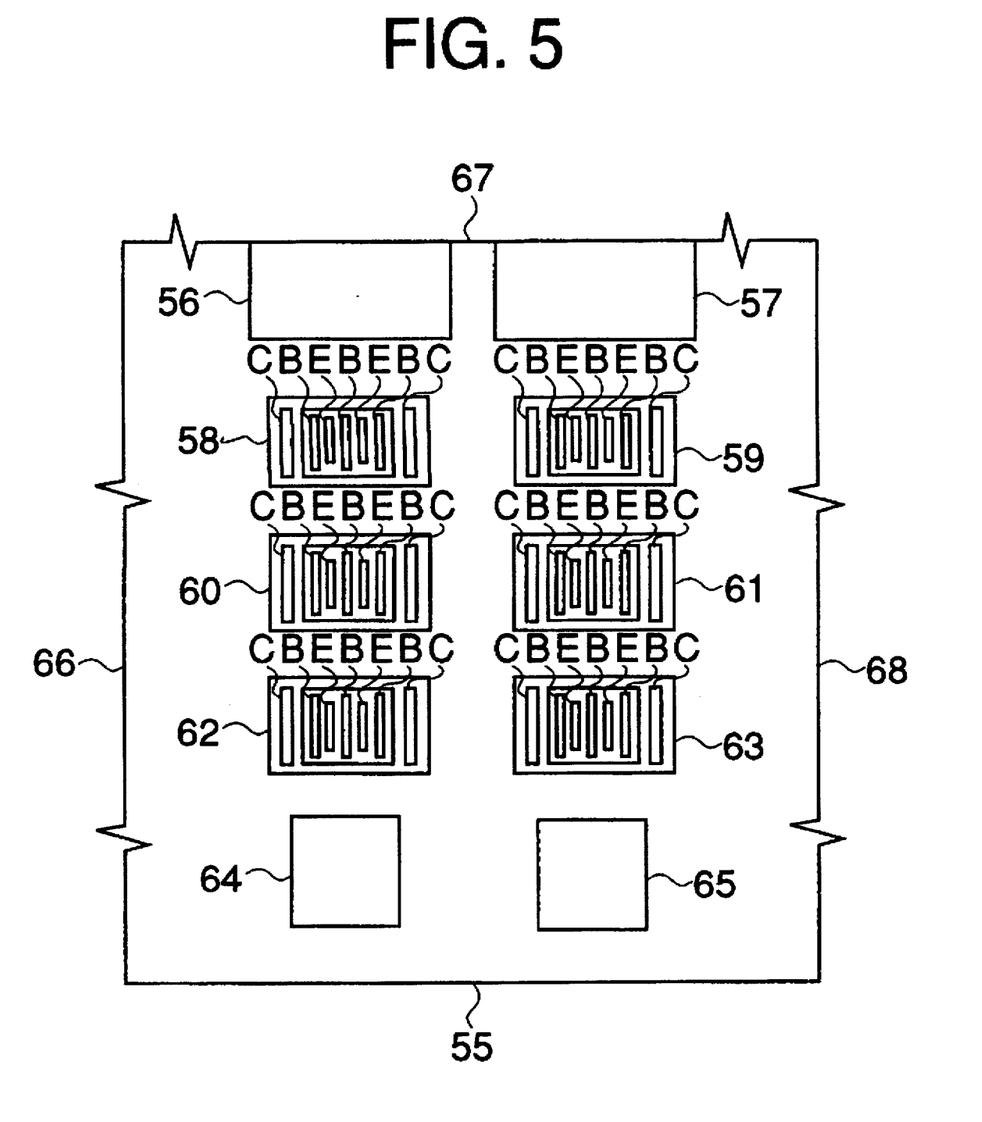
FIG. 5 is a plan view for explaining the operating principle of the present invention.

First, a description will be given of the operating principle of the present invention, by referring to FIG. 5. FIG. 5 generally shows a plan view of a part of an element forming surface of a chip.

FIG. 5 shows one side 55 of the element forming surface of the chip. Output buffer portions (i.e., "output buffers") 56 and 57, output transistors 58 through 63, and pads 64 and 65 are provided on the element forming surface of the chip. In FIG. 5, broken lines 68 through 68 are used for the sake of convenience.

The output buffer circuits 56 and 57 are each made up of a differential amplifier circuit which is provided with a constant current source circuit, and a plurality of resistors are provided to form this constant current source circuit as described above in conjunction with FIG. 1. The output power of the output circuit is set to an arbitrary one of the selectable output powers by selectively using the desired resistors by making appropriate interconnections.

The output transistors 58, 60 and 62 are provided in correspondence with the output buffer portion 56. The pad 64 is provided in correspondence with the output transistors 58, 60 and 62. On the other hand, the output transistors 59, 61 and 63 are provided in correspondence with the output buffer portion 57. The pad 65 is provided in correspondence with the output transistors 59, 61 and 63.

In other words, one (1) output circuit can be formed by the output buffer portion 56, a portion or all of the output transistors 58, 60 and 62, and the pad 64. Similarly, one (1) other output circuit can be formed by the output buffer portion 57, a portion or all of the output transistors 59, 61 and 63, and the pad 65.

When using two (2) arbitrary output transistors, selected from the output transistors 58, 60 and 62 or, when using all of the output transistors 58, 60 and 62, the output transistors which are used are coupled in parallel.

Similarly, when using two (2) arbitrary output transistors, selected from the output transistors 59, 61 and 63 or, when using all of the output transistors 59, 61 and 63, the output transistors which are used are coupled in parallel.

In the present invention, the output buffer portion 56, the output transistors 58, 60 and 62, and the pad 64 are arranged approximately in a line along a direction perpendicular to the side 55 of the element forming surface of the chip adjacent to the pad 64. Likewise, the output buffer portion 57, the output transistors 59, 61 and 63, and the pad 65 are arranged approximately in a line along a direction perpendicular to the side 55 of the element forming surface of the chip adjacent to the pad 65.

Hence, according to the gate array of in the present invention, one (1) output buffer portion, a plurality of output transistors and one (1) pad are provided for the purpose of forming one (1) output circuit. The one (1) output circuit can be formed by the one (1) output buffer portion, a portion or all of the plurality of output transistors, and the one (1) pad. In addition, the one (1) output buffer portion, the plurality of output transistors and the one (1) pad are arranged approximately in a line along a direction perpendicular to the side of the element forming surface of the chip adjacent to the one (1) pad.

As a result, it is possible to narrow the intervals of the pads similarly to the case where only one (1) output transistor is provided. For example, the distance between the pads 64 and 65 can be narrowed. Therefore, it is possible to effectively reduce the chip area.

Next, a description will be given of a first embodiment of a semiconductor integrated circuit according to the present invention, by referring to FIG. 6.

Figure 6:
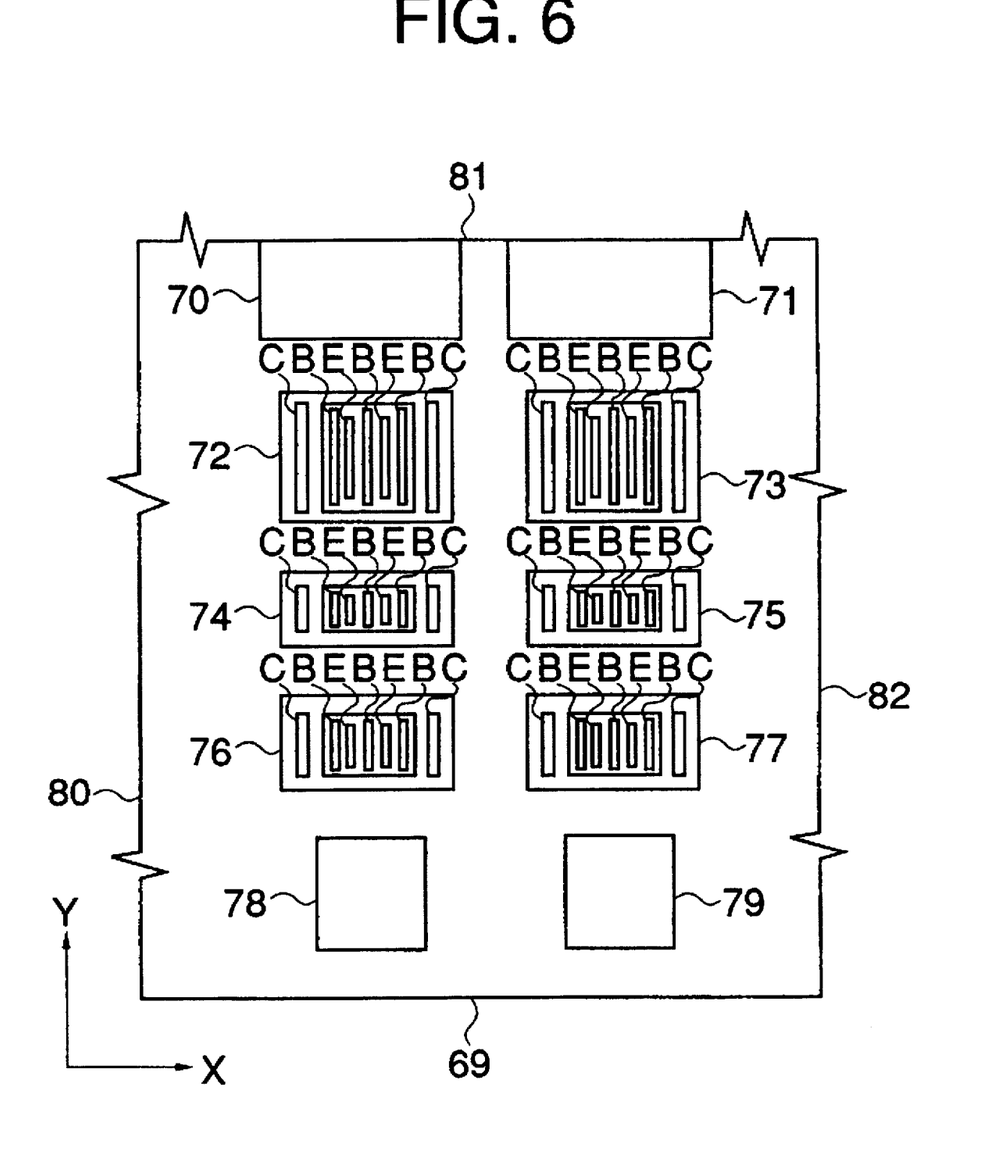
FIG. 6 is a plan view generally showing an important part of a first embodiment of a semiconductor integrated circuit according to the present invention.

FIG. 6 is a plan view generally showing an important part of the first embodiment of the present invention. More particularly, FIG. 6 generally shows the plan view of a portion of the element forming surface of the chip.

The output buffer circuits 70 and 71 are each made up of a differential amplifier circuit which is provided with a constant current source circuit, and wherein a plurality of resistors is provided to form this constant current source circuit as described above in conjunction with FIG. 1. The output power of the output circuit is set to an arbitrary one of the selectable output powers by selectively using the desired resistors by making appropriate interconnections.

FIG. 6 shows one side 69 of the element forming surface of the chip. Output buffer portions 70 and 71, output transistors 72 through 77, and pads 78 and 79 are provided on the element forming surface of the chip. In FIG. 6, broken lines 80 through 82 are used for the sake of convenience.

Each of the output buffer portions 70 and 71 can be adjusted and set to function as an output buffer portion having one of a low power, a middle power or a high power level, by selectively using a plurality of resistors which form the constant current source circuit.

The output transistors 72 and 73 are provided for the low power. The output transistors 74 and 75 are provided for the high power. In addition, the output transistors 76 and 77 are provided for the middle power.

Each of the output transistors 72 through 77 has a cross sectional structure which is approximately the same as that of the output transistor 20 described above. In other words, a cross section taken along a line (not shown) parallel to the side 69 in FIG. 6 is approximately the same as the cross section shown in FIG. 4.

The output transistors 72 through 77 have sizes which are the same when taken in a direction X shown in FIG. 6, but have sizes which are different when taken in a direction Y.

Hence, the output transistors 72 and 73 for the low power have the largest emitter area and have the largest size taken in the direction Y, when compared to the other output transistors 74 through 77.

On the other hand, the output transistors 74 and 75 for the high power have the smallest emitter area and have the smallest size taken in the direction Y, when compared to the other output transistors 72, 73, 76 and 77.

In addition, the output transistors 76 and 77 for the middle power have the intermediate emitter area between the emitter area of the output transistors 72 and 73 and the emitter area of the output transistors 74 and 75, and have the intermediate size between the size of the output transistors 72 and 73 and the size of the output transistors 72 and 75 taken in the direction Y.

The output transistors 72, 74 and 76 are provided in correspondence with the output buffer portion 70, and the pad 78 is provided in correspondence with the output transistors 72, 74 and 76. On the other hand, the output transistors 73, 75 and 77 are provided in correspondence with the output buffer portion 71, and the pad 79 is provided in correspondence with the output transistors 73, 75 and 77.

In other words, one (1) output circuit can be formed by the output buffer portion 70, one of the output transistors 72, 74 and 76, and the pad 78. Similarly, one (1) other output circuit can be formed by the output buffer portion 71, one of the output transistors 73, 75 and 77, and the pad 79.

According to this first embodiment, the output buffer portion 70, the output transistors 72, 74 and 76, and the pad 78 are arranged approximately in a line along a direction perpendicular to the side 69 of the element forming surface of the chip adjacent to the pad 78. Similarly, the output buffer portion 71, the output transistors 73, 75 and 77, and the pad 79 are arranged approximately in a line along a direction perpendicular to the side 69 of the element forming surface of the chip adjacent to the pad 79. For this reason, it is possible to narrow the interval between the pads 78 and 79.

Preferably, the sum of the lengths of the output transistors 72, 74 and 76 along the direction Y is the same as the sum of the lengths of the adjacent output transistors 73, 75 and 77 along the direction Y.

Therefore, according to this first embodiment, the one (1) output buffer portion, the plurality of output transistors and the one (1) pad which are provided for the purpose of forming one (1) output circuit are arranged approximately in a line along a direction perpendicular to the side 69 of the element forming surface of the chip adjacent to the one (1) pad. As a result, it is possible to narrow the intervals of the pads similarly to the case where only one (1) output transistor is provided. Thus, it is possible to effectively reduce the chip area.

Next, a description will be given of a second embodiment of the semiconductor integrated circuit according to the present invention, by referring to FIG. 7.

Figure 7:
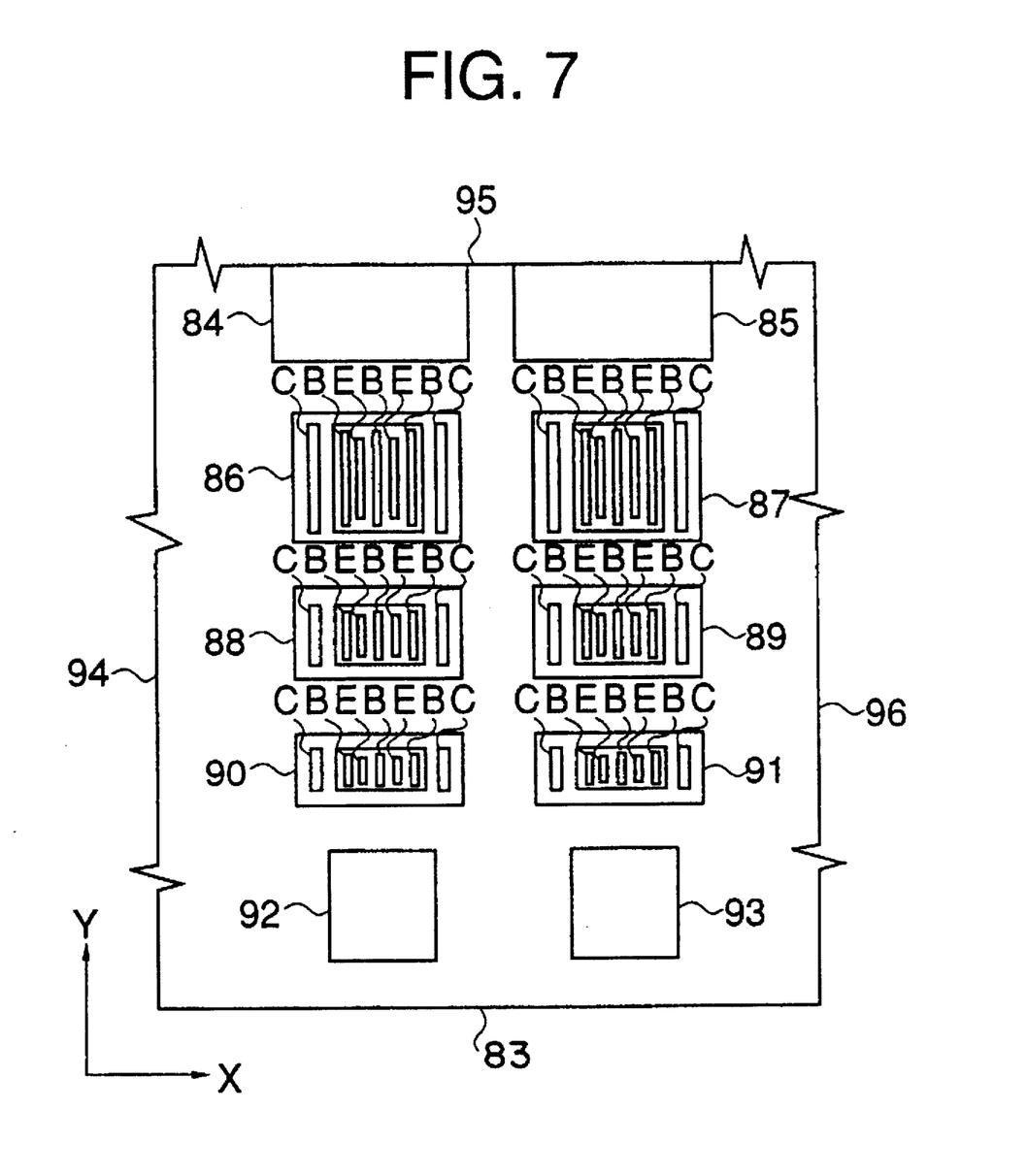
FIG. 7 is a plan view generally showing an important part of a second embodiment of the semiconductor integrated circuit according to the present invention.

FIG. 7 is a plan view generally showing an important part of the second embodiment of the present invention. More particularly, FIG. 7 generally shows the plan view of a portion of the element forming surface of the chip.

The output buffer circuits 84 and 85 are each made up of a differential amplifier circuit which is provided with a constant current source circuit, and wherein a plurality of resisters is provided to form this constant current source circuit as described above in conjunction with FIG. 1. The output power of the output circuit is set to an arbitrary one of the selectable output powers by selectively using the desired resistors by making appropriate interconnections.

FIG. 7 shows one side 83 of the element forming surface of the chips output buffer portions 84 and 85, output transistors 86 through 91, and pads 92 and 93 are provided on the element forming surface of the chip. In FIG. 7, broken lines 94 through 96 are used for the sake of convenience.

Each of the output buffer portions 84 and 85 can be adjusted and set to function as an output buffer portion having one of a low power, a middle power level or a high power, by selectively using a plurality of resistors which form the constant current source circuit.

The output transistors 86 and 87 are provided for the low power. The output transistors 88 and 89 are provided for the middle power. In addition, the output transistors 90 and 91 are provided for the high power.

Each of the output transistors 86 through 91 have a cross sectional structure which is approximately the same as that of the output transistor 20 described above. In other words, a cross section taken along a line (not shown) parallel to the side 83 in FIG. 7 is approximately the same as the cross section shown in FIG. 4.

The output transistors 86 through 91 have sizes which are the same when taken in a direction X shown in FIG. 7, but have sizes which are different when taken in a direction Y. Hence, the output transistors 86 and 87 for the low power have the largest emitter area and have the largest size taken in the direction Y, when compared to the other output transistors 88 through 91.

On the other hand, the output transistors 90 and 91 for the high power have the smallest emitter area and have the smallest size taken in the direction Y, when compared to the other output transistors 86 through 89.

In addition, the output transistors 88 and 89 for the middle power have the intermediate emitter area between the emitter area of the output transistors 86 and 87 and the emitter area of the output transistors 90 and 91, and have the intermediate size between the size of the output transistors 86 and 87 and the size of the output transistors 90 and 91 taken in the direction Y.

The output transistors 86, 88 and 90 are provided in correspondence with the output buffer portion 84, and the pad 92 is provided in correspondence with the output transistors 86, 88 and 90. On the other hand, the output transistors 87, 89 and 91 are provided in correspondence with the output buffer portion 85, and the pad 93 is provided in correspondence with the output transistors 87, 89 and 91.

In other words, one (1) output circuit can be formed by the output buffer portion 84, one of the output transistors 86, 88 and 90, and the pad 92. Similarly, one (1) other output circuit can be formed by the output buffer portion 85, one of the output transistors 87, 89 and 91, and the pad 93.

According to this second embodiment, the output buffer portion 84, the output transistors 86, 88 and 90, and the pad 92 are arranged approximately in a line along a direction perpendicular to the side 83 of the element forming surface of the chip adjacent to the pad 92. Similarly, the output buffer portion 85, the output transistors 87, 89 and 91, and the pad 93 are arranged approximately in a line along a direction perpendicular to the side 83 of the element forming surface of the chip adjacent to the pad 93. For this reason, it is possible to narrow the interval between the pads 92 and 93.

Preferably, the sum of the lengths of the output transistors 86, 88 and 90 along the direction Y is the same as the sum of the lengths of the adjacent output transistors 87, 89 and 91 along the direction Y.

Therefore, according to this second embodiment, the one (1) output buffer portion, the plurality of output transistors and the one (1) pad which are provided for the purpose of forming one (1) output circuit are arranged approximately in a line along a direction perpendicular to the side of the element forming surface of the hip adjacent to the one (1) pad. As a result, it is possible to narrow the intervals of the pads, similarly to the case where only one (1) output transistor is provided. Thus, it is possible to effectively reduce the chip area.

Furthermore, according to this embodiment, the output transistors having the smaller emitter area are arranged at positions closer to the pad. In other words, the closer the output transistor is to the pad, the smaller the emitter area of the output transistor. For example, if the output buffer portion 84 is set to the high power, it is possible to provide a power supply line 97 for supplying the power supply voltage VCC as indicated by the hatching in FIG. 8.

Figure 8:
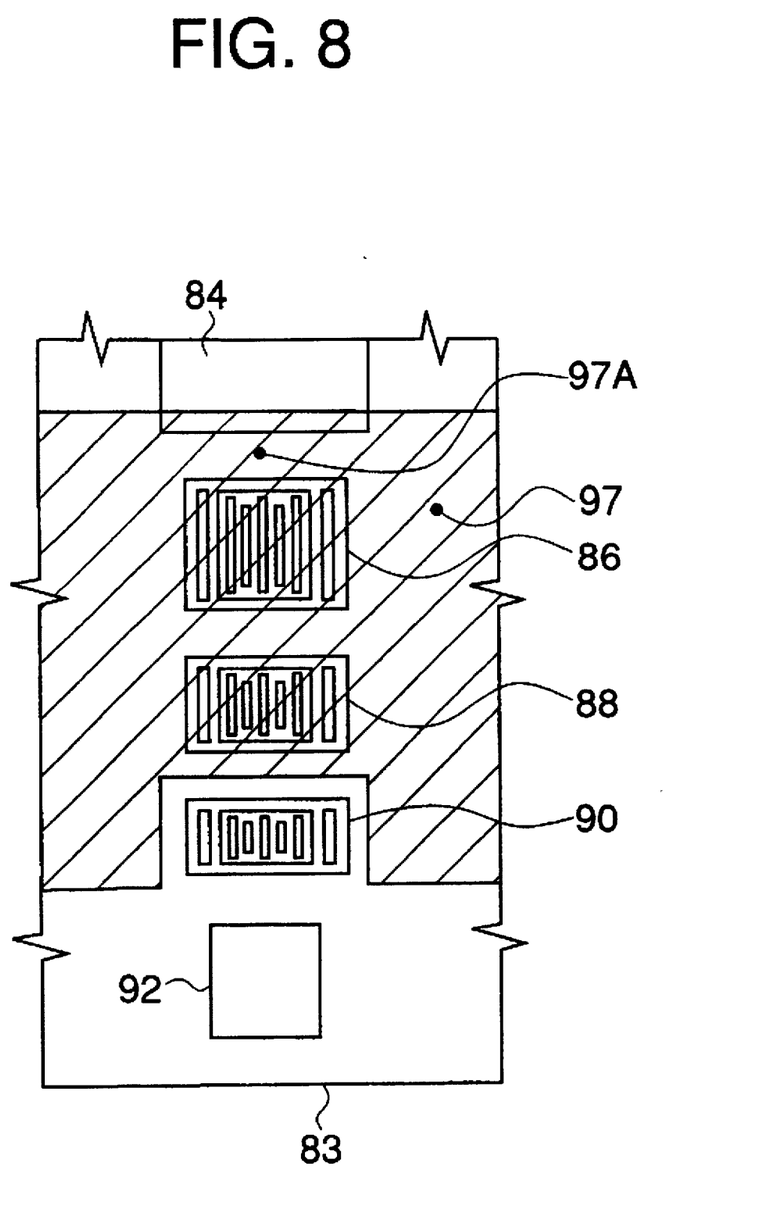
FIG. 8 is a plan view for explaining the effects of the second embodiment.

That is, the output transistor 86 for the low power and the output transistor 88 for the middle power can be positioned below the power supply line 97, with the exception of the output transistor 90 for the high power which is required. Hence, it is possible to efficiently arrange the power supply line 97 so that a relatively large current can be supplied to the output buffer portion 84 and a portion 97A of the power supply line 97 at the output buffer 84 can be made wide.

Figure 9:
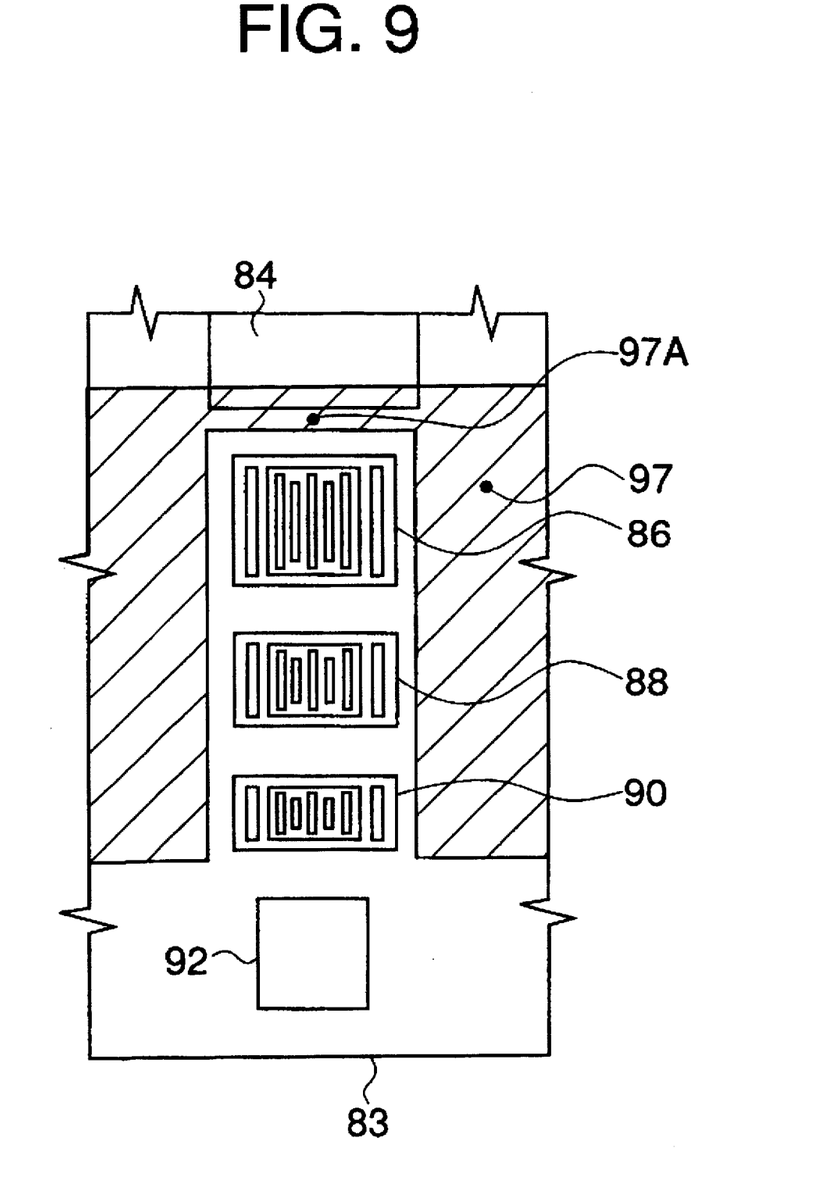
FIG. 9 is a plan view for explaining the effects of the second embodiment.

When the output buffer portion 84 is set to the low power, it is necessary to arrange the power supply line 97 so as to exclude the above output transistors 86, 88 and 90 for the high power, as shown in FIG. 9. However, in this case, the current flowing to the output buffer portion 84 is relatively small. For this reason, no problems will occur even if the portion 97A of the power supply line 97 at the output buffer portion 84 is made narrow.

According to this second embodiment, the output transistors having the smaller emitter areas are arranged closer to the corresponding pad. Therefore, it is possible to efficiently arrange the power supply line for supplying the power supply voltage VCC.

Next, a description will be given of a third embodiment of the semiconductor integrated circuit according to the present invention, by referring to FIG. 10.

Figure 10:
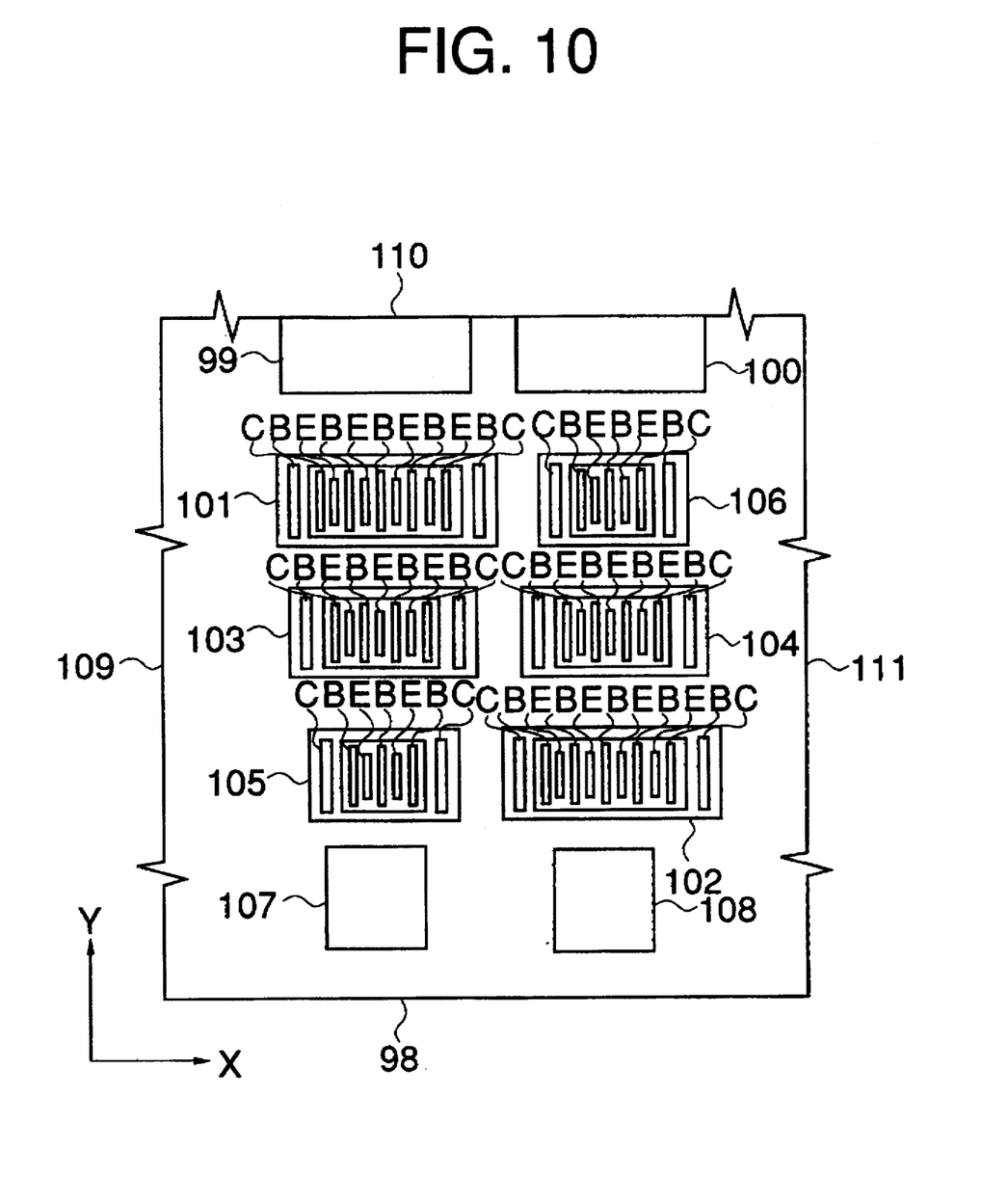
FIG. 10 is a plan view generally showing an important part of a third embodiment of the semiconductor integrated circuit according to the present invention.

FIG. 10 is a plan view generally showing an important part of the third embodiment of the present invention. More particularly, FIG. 10 generally shows the plan view of a portion of the element forming surface of the chip.

FIG. 10 shows one side 98 of the element forming surface of the chip. Output buffer portions 99 and 100, output transistors 101 through 106, and pads 107 and 108 are provided on the element forming surface of the chip. In FIG. 10, broken lines 109 through 111 are used for the sake of convenience.

The output buffer circuits 99 and 100 are each made up of a differential amplifier circuit which is provided with a constant current source circuit, and wherein a plurality of resistors is provided to form this constant current source circuit as described above in conjunction with FIG. 1. The output power of the output circuit is set to an arbitrary one of the selectable output powers by selectively using the desired resistors by making appropriate interconnections.

Each of the output buffer portions 99 and 100 can be adjusted and set to function as an output buffer portion having one of a low power, a middle power level or a high power, by selectively using a plurality of resistors which the constant current source circuit.

The output transistors 101 and 102 are provided for the low power. The output transistors 103 and 104 are provided for the middle power. In addition, the output transistors 105 and 106 are provided for the high power.

Each of the output transistors 101 through 106 has a cross sectional structure which is approximately the same as that of the output transistor 20 described above. In other words, a cross section taken along a line (not shown) parallel to the side 98 in FIG. 10 is approximately the same as the cross section shown in FIG. 4.

The output transistors 101 through 106 have sizes which are the same when taken in a direction Y shown in FIG. 10, but have sizes which are different when taken in a direction X. Hence, the output transistors 101 and 102 for the low power have the largest emitter area and have the largest size taken in the direction X, when compared to the other output transistors 103 through 106.

On the other hand, the output transistors 105 and 106 for the high power have the smallest emitter area and have the smallest size taken in the direction X, when compared to the other output transistors 101 through 104.

In addition, the output transistors 103 and 104 for the middle power have the intermediate emitter area, between the emitter area of the output transistors 101 and 102 and the emitter area of the output transistors 105 and 106, and have the intermediate size between the size of the output transistors 101 and 102 and the size of the output transistors 105 and 106 taken in the direction X.

The output transistors 101, 103 and 105 are provided in correspondence with the output buffer portion 99, and the pad 107 is provided in correspondence with the output transistors 101, 103 and 105. On the other hand, the output transistors 102, 104 and 106 are provided in correspondence with the output buffer portion 100, and the pad 108 is provided in correspondence with the output transistors 102, 104 and 106.

In other words, one (1) output circuit can be formed by the output buffer portion 99, one of the output transistors 101, 103 and 105, and the pad 107. Similarly, one (1) other output circuit can be formed by the output buffer portion 100, one of the output transistors 102, 104 and 106, and the pad 108.

According to this third embodiment, the output buffer portion 99, the output transistors 101, 103 and 105, and the pad 107 are arranged approximately in a line along a direction perpendicular to the side 98 of the element forming surface of the chip adjacent to the pad 107. Similarly, the output buffer portion 100, the output transistors 106, 104 and 102, and the pad 108 are arranged approximately in a line along a direction perpendicular to the side 83 of the element forming surface of the chip adjacent to the pad 108.

In addition, the output transistor 101 for the low power having the largest width in the direction X and the output transistor 106 for the high power having the smallest width in the direction X are arranged adjacent to each other along the direction X. Moreover, the output transistor 103 for the middle power and having the intermediate width in the direction X and the output transistor 104 for the middle power having the intermediate width in the direction X are arranged adjacent to each other along the direction X. Furthermore, the output transistor 105 for the high power having the smallest width in the direction X and the output transistor 102 for the low power having the largest width in the direction X are arranged adjacent to each other along the direction X.

In other words, the output buffer portion 99, the output transistors 101, 103 and 105 and the pad 107 which are provided for forming one (1) output circuit are arranged approximately in a line along the direction Y. In addition, when the sizes of the output transistors 101, 103 and 105 are different along the direction X, these output transistors 101, 103 and 105 are arranged so that the sum of the sizes of the output transistors 101 and 106 in the direction X, the sum of the sizes of the output transistors 103 and 104 in the direction X, and the sum of the sizes of the output transistors 105 and 102 in the direction X become the same. The output transistors 106, 104 and 102 are provided adjacent to the output transistors 101, 103 and 105 in the direction X, and are provided for forming the other output circuit.

Therefore, it is possible to minimize the interval of the pads 107 and 108 by the above described arrangement of the output transistors 101 through 106 which have the same size in the direction Y and have different sites in the direction X.

According to this third embodiment, one (1) output buffer portion, a plurality of output transistors and one (1) pad which are provided for forming one (1) output circuit are arranged approximately in a line perpendicular to the side of the element forming surface of the chip adjacent to this one (1) pad.

In addition, when the plurality of output transistors which are provided for forming one (1) output circuit have different sizes in a first direction, perpendicular to a second direction in which the output transistors are arranged, the output transistors are arranged so that the sum of the sizes of two (2) output transistors which are adjacent in the first direction is the same for each pair of output transistors which are adjacent in the first direction and which respectively form two (2) different output circuits.

As a result, even when the plurality of output transistors which form one (1) output circuit have different sizes in the first direction, it is possible to narrow the interval between the pads and, accordingly, to reduce the chip area.

In each of the above described embodiments, three (3) output transistors are provided for forming one (1) output circuit, and an arbitrary one (1) of the three (3) output transistors is used. However, it is possible to use two (2) or three (3) output transistors, out of the three (3) output transistors. In this case, it is possible to easily connect the emitters of the two (2) or three (3) output transistors, because the direction in which the emitter windows of the output transistors extend is the same as the direction in which the output transistors are arranged.

In addition, it is possible to provide only two (2) output transistors for forming one (1) output circuit, or to provide 4 or more output transistors for forming one (1) output circuit.

Next, a description will be given of a fourth embodiment of the semiconductor integrated circuit according to the present invention, by referring to FIG. 11.

Figure 11:
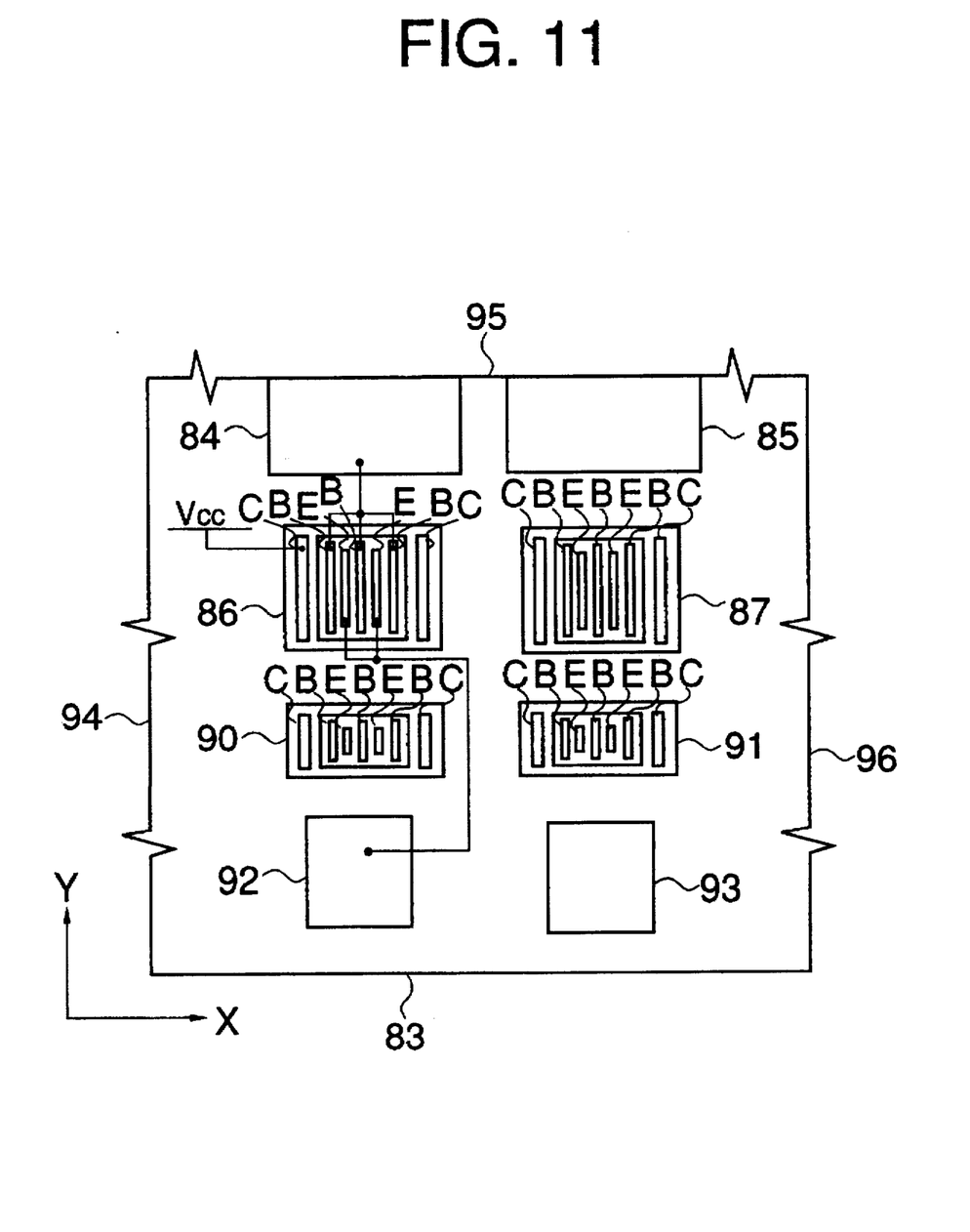
FIG. 11 is a plan view generally showing an important part of a fourth embodiment of the semiconductor integrated circuit according to the present invention.

FIG. 11 is a plan view generally showing an important part of the fourth embodiment of the present invention. More particularly, FIG. 11 generally shows the plan view of a portion of the element forming surface of the chip. In FIG. 11, those parts which are the same as those corresponding parts in FIG. 7 are designated by the same reference numerals, and a description thereof will be omitted.

In this embodiment, no output transistors for the middle power are provided. In other words, only the output transistors 88 and 87 for the low power and the output transistors 90 and 91 for the high power are provided. In this embodiment, although the output transistors for the middle power are not provided, it is possible to realize the functions of the output transistors for the middle power by suitably connecting the output transistors 88 and 87 for the low power and the output transistors 90 and 91 for the high power.

In this particular case, the output transistor 14 shown in FIG. 1 is realized by connecting the output transistor 86 as shown in FIG. 11. In this case, the collector C of the output transistor 86 is coupled to the power supply line 7 shown in FIG. 1. The bases B of the output transistor 86 are coupled in common to the node 16 shown in FIG. 1 of the output buffer portion 84 which corresponds to the output buffer portion 6 shown in FIG. 1. In addition, the emitters E of the output transistor 88 are coupled in common to the pad 92 which corresponds to the pad 15 shown in FIG. 1.

Further, the present invention is not limited to these embodiments, but various variations and modifications may be made without departing from the scope of the present invention.

What is claimed is:

1. A semiconductor integrated circuit comprising:
   a chip having an element forming surface and a side, the side extending in a first direction;
   a first output buffer on the element forming surface of the chip;
   plural first output transistors having corresponding emitter areas of respective, different emitter area sizes, ranging from relatively largest to relatively smallest sizes and arranged on the element forming surface of the chip along a second direction which is perpendicular to the first direction; and
   a first pad on the element forming surface of the chip, the first output buffer, at least one of the plural first output transistors and the first pad comprising a first output circuit and the first output buffer, the plural first output transistors and the first pad being arranged along the second direction with the first output transistor having the relatively smallest emitter area size, of the plural first output transistors, being arranged closest to the first pad.

2. The semiconductor integrated circuit as claimed in claim 1, wherein the first output buffer comprises a differential amplifier circuit having a constant current source circuit including a plurality of resisters, an output power of the first output circuit being set to an arbitrary one of selectable, different output powers by interconnecting desired, selected resisters.

3. The semiconductor integrated circuit as claimed in claim 1, wherein the plural first output transistors having corresponding emitter areas of successive, relatively larger emitter area sizes are arranged at successively farther, displaced positions from the first pad.

4. The semiconductor integrated circuit as claimed in claim 1, wherein the plural first output transistors have a common dimensional size along the first direction but have respective, relatively different dimensional sizes along the second direction.

5. The semiconductor integrated circuit as claimed in claim 4, wherein the plural first output transistors have respective emitters, further comprising:
   an insulating layer covering the plural first output transistors and respectively having plural windows therein through which the respective emitters of the plural first output transistors are exposed and which plural windows extend in the second direction.

6. The semiconductor integrated circuit as claimed in claim 1, wherein the plural first output transistors have a common dimensional size along the second direction but have respective, different dimensional sizes along the first direction.

7. The semiconductor integrated circuit as claimed in claim 6, wherein the plural first output transistors have respective emitters, further comprising:

an insulating layer covering the plural first output transistors and having plural windows therein through which the respective emitters of the plural first output transistors are exposed and which plural windows extend in the second direction.

8. The semiconductor integrated circuit as claimed in claim 1, which further comprises:

a second output buffer on the element forming surface of the chip;

plural second output transistors having corresponding emitter areas of respective, different emitter area sizes, ranging from relatively largest to relatively smallest sizes, and arranged on the element forming surface of the chip along the second direction; and a second pad on the element forming surface of the chip, the second output buffer, at least one of the plural second output transistors and the second pad comprising a second output circuit and the second output buffer, the plural second output transistors and the second pad being arranged along the second direction, adjacent to and spaced in the first direction from the first output buffer, the first output transistors and the first pad, respectively.

9. The semiconductor integrated circuit as claimed in claim 8, wherein:

respective widths of the plural first output transistors and the plural second output transistors in the first direction are the same; and a sum of respective lengths of the plural first output transistors, along the second direction, and a sum of respective lengths of the plural second output transistors, along the second direction, are the same.

10. The semiconductor integrated circuit as claimed in claim 9, wherein the plural second output transistors have corresponding emitter areas of respective, different emitter area sizes ranging from relatively largest to relatively smallest sizes with the second output transistor having the relatively smallest emitter area, of the plural second output transistors, arranged closest to the second pad.

11. The semiconductor integrated circuit as claimed in claim 10, wherein the plural first output transistors and the plural second output transistors have respective emitters, further comprising:

an insulating layer covering the plural first output transistors and the plural second output transistors and having plural emitter windows therein through which the plural and respective emitters ate exposed and each of which windows has a first dimension in the first direction and a second dimension, relatively larger than the first dimension, in the second direction.

12. The semiconductor integrated circuit as claimed in claim 8, wherein:

respective lengths of the plural first output transistors and the plural second output transistors in the second direction are the same; and a sum of respective widths of the plural first output transistors, along the first direction, and a sum of respective widths of the plural second output transistors, along the first direction, are the same.

13. The semiconductor integrated circuit as claimed in claim 12, wherein the plural first output transistors and the plural second output transistors have respective emitters, further comprising:

an insulating layer covering the plural first output transistors and the plural second output transistors and having plural emitter windows therein through which the plural and respective emitters are exposed and each of which windows has a first dimension in the first direction and a second dimension, relatively larger than the first dimension, in the second direction.

* * * * *

UNITED STATES PATENT AND TRADEMARK OFFICE
CERTIFICATE OF CORRECTION

PATENT NO. : 5,694,078
DATED : Dec. 2, 1997
INVENTOR(S) : NOMURA et al.

It is certified that error appears in the above-identified patent and that said Letters Patent is hereby corrected as shown below:

Col. 1, line 40, change "rem" to --rendering--;
line 55, change "the" (first occurrence) to --a--.

Col. 3, line 5, delete "becomes";
line 30, after "these" insert --three--.

Col. 8, line 4, change "chips output" to --chip. Output--.

Col. 12, line 14, change "88" to --86--.

Col. 14, line 14 (Claim 11, line 8), change "ate" to --are--.

Signed and Sealed this

Fourteenth Day of April, 1998

Attest:

BRUCE LEHMAN

Attesting Officer     Commissioner of Patents and Trademarks